(12) United States Patent
Takehara (10) Patent No.: US 10,161,574 B2
(45) Date of Patent: Dec. 25, 2018

(54) LIGHT-EMITTING DEVICE, LIGHTING DEVICE, AND METHOD OF MANUFACTURING LIGHT-EMITTING DEVICE

(71) Applicant: PANASONIC INTELLECTUAL PROPERTY MANAGEMENT CO., LTD., Osaka (JP)

(72) Inventor: Kosuke Takehara, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/671,254

(22) Filed: Aug. 8, 2017

(65) Prior Publication Data

US 2018/0058641 A1 Mar. 1, 2018

(30) Foreign Application Priority Data

Aug. 24, 2016 (JP) .................. 2016-164146

(51) Int. Cl.
*F21K 2/00* (2006.01)
*F21K 9/64* (2016.01)
*F21K 9/90* (2016.01)

(52) U.S. Cl.
CPC . *F21K 9/64* (2016.08); *F21K 9/90* (2013.01)

(58) Field of Classification Search
CPC .................... F21K 9/64; F21K 9/90

USPC ............................................ 362/84; 250/581
See application file for complete search history.

(56) References Cited

U.S. PATENT DOCUMENTS 7,265,371 B2 * 9/2007 Shoji .................. B32B 3/00
250/581
2012/0112622 A1 5/2012 Suzuki et al.

FOREIGN PATENT DOCUMENTS

| JP | 2009-081349 A | 4/2009 |
| JP | 2010-205788 A | 9/2010 |
| JP | 2011-023484 A | 2/2011 |
| JP | 2011-253846 A | 12/2011 |
| JP | 2013-004704 A | 1/2013 |

* cited by examiner

*Primary Examiner* — Karl D Frech
(74) *Attorney, Agent, or Firm* — Greenblum & Bernstein, P.L.C.

(57) ABSTRACT

A light-emitting device is provided. The light-emitting device includes a substrate and a base on or defined by the substrate. A light-emitting element is above the base. An adhesive fixes the light-emitting element above the base. A sealant seals the light-emitting element and includes a phosphor that emits fluorescent light when stimulated by light from the light-emitting element. In a plan view of the base and the light-emitting element, a span of at least part of the base is less than or equal to a corresponding span of the light-emitting element.

20 Claims, 7 Drawing Sheets

LIGHT-EMITTING DEVICE, LIGHTING DEVICE, AND METHOD OF MANUFACTURING LIGHT-EMITTING DEVICE

CROSS REFERENCE TO RELATED APPLICATION

This application claims the benefit of priority of Japanese Patent Application Number 2016-164146 filed on Aug. 24, 2016, the entire content of which is hereby incorporated by reference.

BACKGROUND

1. Technical Field

The present disclosure relates to: a light-emitting device including a substrate and a light-emitting element mounted on the substrate; a lighting device including the light-emitting device; and a method of manufacturing a light-emitting device.

2. Description of the Related Art

A conventional light-emitting body including a substrate, a semiconductor light-emitting element mounted on the substrate, a light-transmissive sealing resin that covers the semiconductor light-emitting element, and an adhesive that mounts the semiconductor light-emitting element to the substrate is known (for example, see Japanese Unexamined Patent Application Publication No. 2013-4704).

SUMMARY

However, with the conventional light-emitting device, even when the light-emitting element is sealed using the sealant after a reflow process in which the light-emitting element is placed on the adhesive, the relative positioning of the light-emitting element and the sealant shifts, leading to non-uniform emission of light by the light-emitting device.

In light of this, the present disclosure has an object to provide a light-emitting device, a lighting device, and a method of manufacturing a light-emitting device which inhibit non-uniform emission of light by the light-emitting device.

In order to achieve the above object, a light-emitting device according to one aspect of the present invention includes: a substrate; a base on or defined by the substrate; a light-emitting element above the base; an adhesive that fixes the light-emitting element above the base; and a sealant that seals the light-emitting element and includes a phosphor that emits fluorescent light when stimulated by light from the light-emitting element. In a plan view of the base and the light-emitting element, a span of at least a part of the base is less than or equal to a corresponding span of the light-emitting element.

With the present disclosure, it is possible to inhibit non-uniform emission of light by the light-emitting device.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

The following describes embodiments with reference to the drawings. Note that the embodiments described below each show a specific example of the present disclosure. The numerical values, shapes, materials, elements, the arrangement and connection of the elements, etc., indicated in the following embodiments are mere examples, and therefore do not intend to limit the inventive concept. Therefore, among elements in the following embodiments, those not recited in any of the independent claims defining the broadest conception of the inventive concept are described as optional elements.

Moreover, "approximately" means, for example in the case of "approximately the same," not only exactly the same, but what would be recognized as essentially the same as well.

Note that the figures are schematic diagrams and are not necessarily precise illustrations. Additionally, like reference signs indicate like elements in the figures. As such, overlapping explanations of like elements are omitted or simplified.

Embodiment 1

Hereinafter, light-emitting device 10 according to an embodiment of the present disclosure will be described.
(Configuration)

First, light-emitting device 10 according to this embodiment will be described with reference to FIG. 1.

Figure 1:
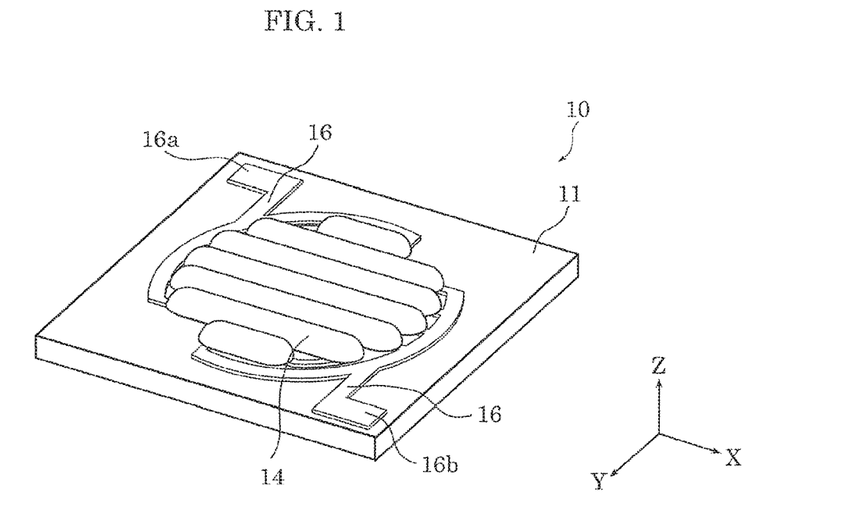
FIG. 1 is an external perspective view of the light-emitting device according to Embodiment 1.
Figure 2:
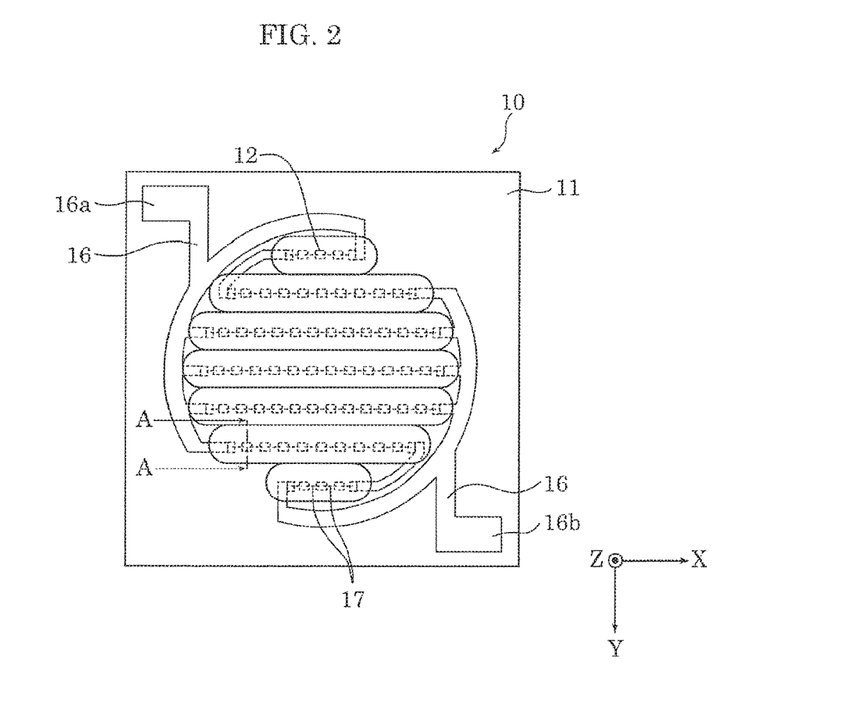
FIG. 2 is a plan view of the light-emitting device according Embodiment 1.
Figure 3:
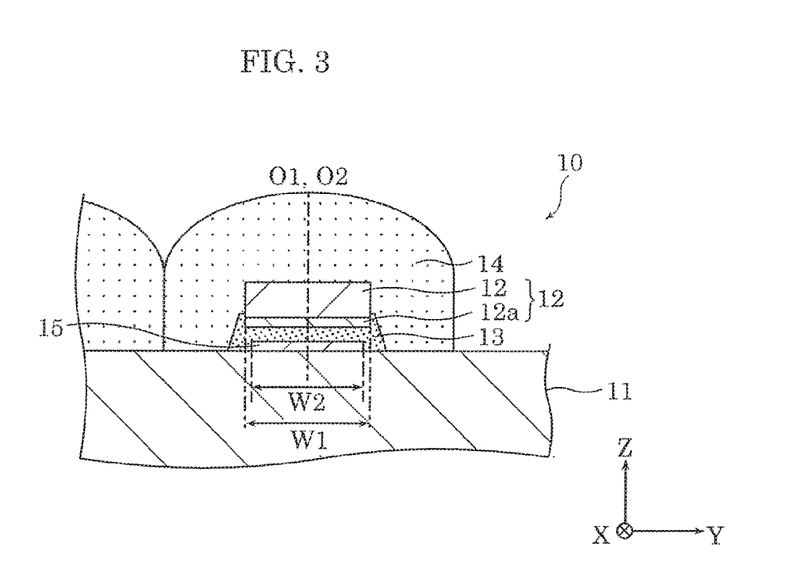
FIG. 3 is an enlarged cross sectional view of part of the light-emitting device taken at line A-A in FIG. 2.

FIG. 1 is an external perspective view of light-emitting device 10 according to this embodiment. FIG. 2 is a plan view of light-emitting device 10 according to this embodiment. FIG. 3 is an enlarged cross sectional view of part of light-emitting device 10, taken at line A-A in FIG. 2. FIG. 3 is a plan view of light-emitting device 10 according to this embodiment. Note that the illustration of bonding wires 17 is omitted from FIG. 3, FIG. 4, and FIG. 8.

In FIG. 1, with respect to light-emitting device 10, the LED chip optical axis direction is defined as the Z axis positive direction, a direction orthogonal to the Z axis positive direction is defined as the X axis positive direction, and a direction orthogonal to both the X axis positive direction and the Z axis positive direction is defined as the Y axis positive direction. The directions illustrated in FIG. 2 correspond to the directions illustrated in FIG. 1. Note that in FIG. 1, the X axis, Y axis, and Z axis directions may change depending on application, and are therefore not limited to the illustrated example. The same applies to the subsequent figures.

As illustrated in FIG. 1 through FIG. 3, light-emitting device 10 according to this embodiment includes substrate 11, LED chips 12, adhesive 13, and sealant 14.

Light-emitting device 10 is a chip-on-board (COB) LED module in which LED chips 12 (each of which is one example of the light-emitting element) are directly mounted to substrate 11.

Substrate 11 is a rectangular substrate having a line region in which lines 16 are provided. As illustrated in FIG. 3, bases 15 are provided on (the front surface of) substrate 11.

As illustrated in FIG. 3, each base 15 is a protrusion provided on substrate 11, and in this embodiment, is, for example, a thin film such as a metallic thin film containing aluminum and/or copper, etc., or a resin thin film. In this embodiment, each base 15 has a thickness of approximately 20 μm. Bases 15 are not limited to thin films; bases 15 may be protrusions that are integral with substrate 11. In such cases, third films such as metallic/resin thin films need not be prepared.

In this embodiment, each base 15 is exemplified as, but not limited to, having a square shape in a plan view (i.e., when a plane defined by the X and Y axes is viewed in the negative direction along the Z axis); each base 15 may have a circular, triangular, semicircular, or rectangular shape, or any combination thereof, in a plan view.

LED chips 12 are arranged above (in the Z axis positive direction from) bases 15, and adhesive 13 is disposed between LED chips 12 and bases 15. In this embodiment, bases 15 are disposed on substrate 11 so as to correspond one-to-one with LED chips 12. In other words, bases 15 are disposed so as to determine the positions of LED chips 12 and adhesive 13.

In a plan view of substrate 11 and LED chips 12, the width of at least part of each base 15 is less than or equal to the width of each LED chip 12. In other words, each base 15 may be approximately the same size as each LED chip 12 (X axis widths and Y axis widths may be approximately the same). For example, each base 15 may have an X and/or Y axis width that is narrower than an X and/or Y axis width of each LED chip 12.

In this embodiment, the X axis width (i.e., width measured in the alignment direction) of each base 15 is less than or equal to the X axis width of each LED chip 12, and the Y axis width (i.e., width measured in a direction approximately perpendicular to the alignment direction) of each base 15 is less than or equal to the Y axis width of each LED chip 12. In other words, in a plan view of substrate 11 and LED chips 12, the entirety of each base 15 is covered by one of LED chips 12 such that bases 15 are not visible when viewed looking straight at the front surface (the positive Z axis surface). In this embodiment, each base 15 is square in shape and has X and Y axis widths that are narrower than the respective X and Y axis widths of each LED chip 12.

As illustrated in FIG. 3, the Y axis width of each LED chip 12 is defined as width W1, the Y axis width of each base 15 is defined as width W2, and the widths satisfy the relationship width W1≥width W2. The same applies to the relationship between the X axis widths of each LED chip 12 and base 15.

Bases 15 and LED chips 12 are exemplified as, but not limited to, corresponding one-to-one; for example, a single, elongated base 15 may extend in the alignment direction of LED chips 12. In such cases, two or more LED chips 12 are mounted on a single base 15.

As illustrated in FIG. 1 and FIG. 2, lines 16 (electrodes 16a and 16b) on substrate 11 are metal lines for supplying power to LED chips 12. Substrate 11 is, for example, a metal-based substrate or a ceramic substrate. Substrate 11 may also be a resin-based substrate.

Ceramic substrate examples include alumina substrates made of aluminum oxide (alumina), and aluminum nitride substrates made of aluminum nitride. Metal-based substrate examples include aluminum alloy, iron alloy, or copper alloy substrates whose front surfaces are coated with an insulating film. Resin-based substrate examples include glass epoxy substrates made of fiber glass and epoxy resin.

Note that a substrate having a high optical reflectance (for example, an optical reflectance of 90%), for example, may be used as substrate 11. When a substrate having a high optical reflectance is used as substrate 11, light emitted by LED chips 12 can be reflected off the front surface of substrate 11. This increases the light extraction efficiency of light-emitting device 10. One example of such a substrate is an alumina-based white ceramic substrate.

A light-transmissive substrate having a high transmittance of light may also be used as substrate 11. Examples of such a substrate include a light-transmissive ceramic substrate made of polycrystalline alumina or aluminum nitride, a clear glass substrate made of glass, a crystal substrate made of crystal, a sapphire substrate made of sapphire, and a clear resin substrate made of a clear resin material.

Although substrate 11 is exemplified as being rectangular in this embodiment, substrate 11 may be circular or some other shape.

As illustrated in FIG. 3, metallic thin film 12a containing, for example, aluminum and/or copper, is disposed on the rear surface of LED chip 12 (the surface on the base 15 side; negative Z axis surface). Metallic thin film 12a may be an integral part of base 15, and may be a resin thin film instead of a metallic thin film.

LED chips 12 are fixed to bases 15 via adhesive 13. More specifically, each LED chip 12 is fixed on a base 15 via adhesive 13 such that centerline O1 of each LED chip 12 and centerline O2 of each base 15 and sealant 14 are substantially aligned. In this embodiment, adhesive 13 is provided so as to cover bases 15 and the rear surface side of LED chips 12, and fixes each LED chip 12 above bases 15 and substrate 11. Note that a centerline is a straight line that passes through the center of a component (here, base 15, LED chip, sealant 14) and is approximately perpendicular to substrate 11. In this embodiment, solder cream containing solder particles (oriented conduction paste) is used as adhesive 13, but adhesive 13 is not limited to this example; some other adhesive may be used as adhesive 13. Note that adhesive 13 refers to hardened adhesive after having been treated with a reflow process, and adhesive 13' to be described later refers to adhesive in paste form before being treated with a reflow process.

In this embodiment, each LED chip 12 has a plan view size of approximately 0.5 mm×1 mm, and has a thickness of from approximately 150 μm to 200 μm.

LED chips 12 include first LED chips and second LED chips.

First LED chips are one example of the light-emitting element, and are blue LED chips that emit blue light. For example, gallium nitride LED chips formed of an InGaN material and having an emission peak wavelength (emission spectrum peak wavelength) between 430 nm and 480 nm, inclusive, are used as the first LED chips.

Second LED chips are one example of the light-emitting element, and are LED chips that emit light having an emission peak wavelength higher than that of the first LED chips, such as red LED chips that emit red light. For example, gallium nitride LED chips formed of an AlGaInP material and having an emission peak wavelength between 600 nm and 660 nm, inclusive, are used as the second LED chips. Note that the first LED chips and the second LED chips among LED chips 12 are covered by sealant 14 to be described later.

A plurality of light-emitting element rows each including a plurality of LED chips 12 are provided on substrate 11. Structurally, seven linear light-emitting element rows are provided on substrate 11 so as to collectively form a circular shape.

Electrically, five light-emitting element rows each including twelve LED chips 12 connected in series are provided on substrate 11. These five light-emitting element rows are connected to one another in parallel, and emit light when power flows across electrode 16a and electrode 16b.

In an overall view of substrate 11, the first LED chips and the second LED chips may be arranged so as to be approximately evenly distributed. For example, electrically, in one light-emitting element row, the first LED chips and the second LED chips may be provided so as to satisfy a predetermined ratio between the first LED chips and the second LED chips.

Moreover, LED chips 12 connected together in series are mainly connected in a chip-to-chip configuration via bonding wires 17 (some LED chips 12 are connected via lines 16). Note that, for example, gold (Au), silver (Ag), and/or copper (Cu) is used as the metal material for bonding wires 17, lines 16, electrode 16a, and electrode 16b.

Sealant 14 is provided on substrate 11 and is a sealing resin that seals a plurality of LED chips 12 and bonding wires 17. More specifically, sealant 14 directly seals a plurality of LED chips 12. Stated differently, sealant 14 is provided on substrate 11 so as to cover all LED chips 12. In this embodiment, each strip of sealant 14 protrudes in the direction of travel of light from LED chips 12 (in the positive direction along the Z axis), is elongated in the alignment direction of LED chips 12, and has a cross sectional shape that is semicircular (semicircular shape in a cross sectional view). Each strip of sealant 14 is disposed such that the optical axis of each LED chip 12 passes through the peak region of sealant 14. With this, red light from LED chips 12 that passes through sealant 14 is radiated from the spherical surface (boundary surface) of sealant 14 without being totally reflected.

Note that in this embodiment, sealant 14 is exemplified as having a semicircular shape in a cross sectional view, but sealant 14 need not be completely semispherical; it is sufficient if it has an approximately semicircular shape in a cross sectional view. Moreover, sealant 14 may be formed into a shape other than an approximately semicircular shape in a cross sectional view; the shape of the surface of sealant 14 may be flat or curved.

Sealant 14 is made of a light-transmissive resin material containing yellow and green phosphor particles as wavelength converters. For example, silicon resin is used as the light-transmissive resin material, but examples of other materials that may be used include epoxy resin and urea resin. Yttrium aluminum garnet (YAG) phosphor (phosphor particles) is used for the green and yellow phosphor particles.

With this configuration, the wavelength of a portion of the blue light emitted from first LED chips is converted into yellow light by the yellow phosphor particles included in sealant 14. Similarly, the wavelength of a portion of the blue light emitted from first LED chips is converted into green light by the green phosphor particles included in sealant 14. The blue light not absorbed by the yellow or green phosphor particles, the yellow light converted by the yellow phosphor particles, the green light converted by the green phosphor particles, and the red light emitted by the second LED chips diffuse and mix in sealant 14. With this, white light with increased color rendering properties is emitted from sealant 14.

Note that sealant 14 also has a function of protecting LED chips 12 and bonding wires 17 from refuse, moisture, external forces, etc.

(Manufacturing Method)

Next, a method of manufacturing light-emitting device 10 will be described with reference to FIG. 5 through FIG. 7.

Figure 5:
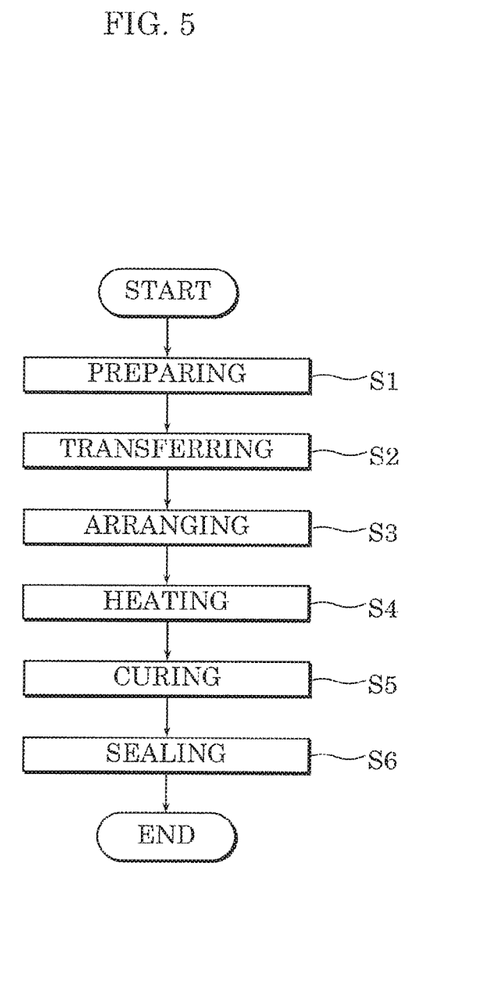
FIG. 5 is a flow chart illustrating the method of manufacturing the light-emitting device according to Embodiment 1.

FIG. 5 is a flow chart illustrating the method of manufacturing light-emitting device 10 according to this embodiment. FIG. 6 schematically illustrates steps included in the method of manufacturing light-emitting device 10 according to this embodiment. FIG. 7 schematically illustrates steps included in the method of manufacturing light-emitting device 10 according to this embodiment. In FIG. 6 and FIG. 7, cross sections of light-emitting device 10 including, for example, substrate 11, are illustrated. Illustration of bonding wires 17 are omitted in FIG. 7.

Figure 6:
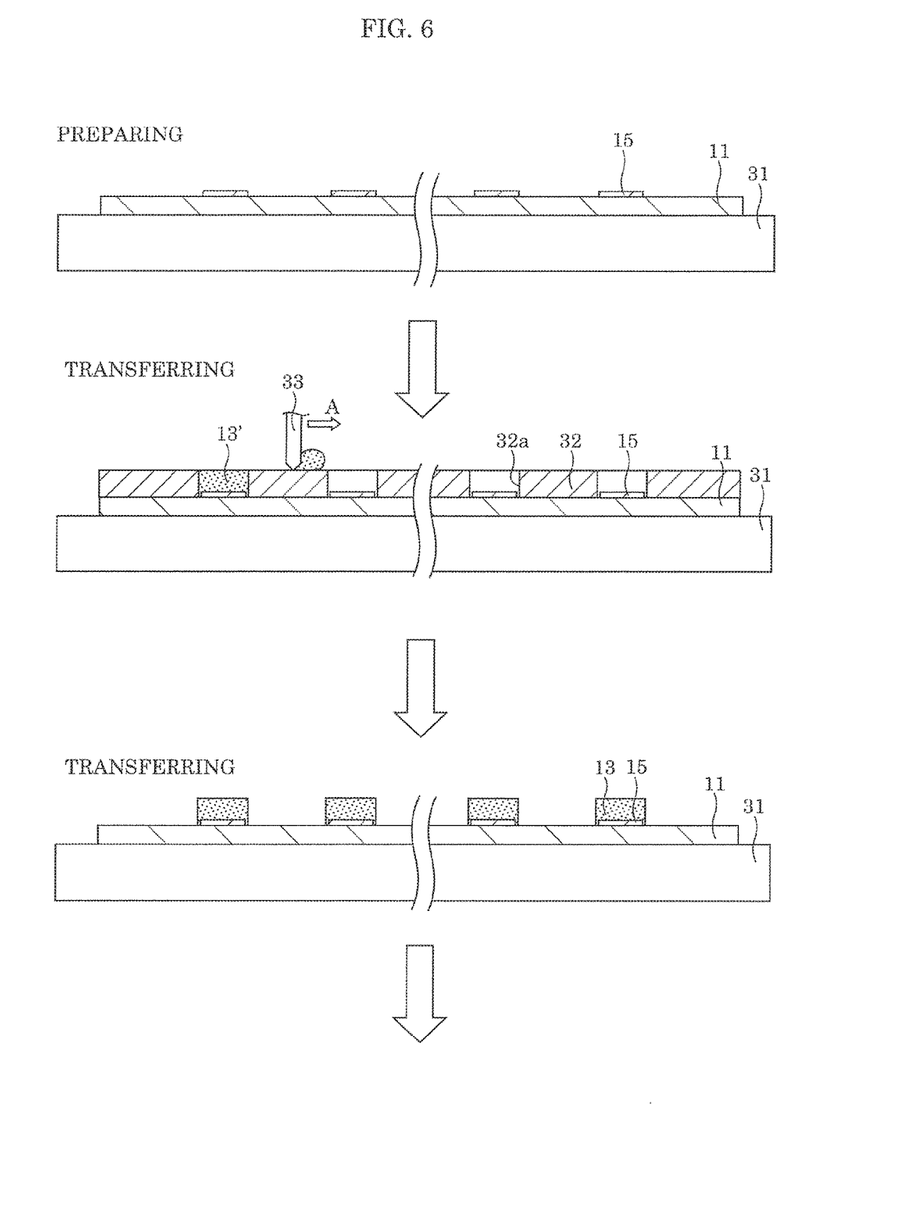
FIG. 6 schematically illustrates steps included in the method of manufacturing the light-emitting device according to Embodiment 1.

As illustrated in FIG. 5 and FIG. 6, first, substrate 11 on which bases 15, which define the positions of LED chips 12, are arranged is prepared (step S1: preparing). Substrate 11 is placed on pedestal 31 and fixed to pedestal 31 with, for example, a jig.

Next, adhesive 13' is transferred onto bases 15. Note that in this exemplary embodiment, the transferring method is exemplified as a screen printing method, but the transferring may be performed by pressure dispensing using a dispenser, or stamping using a pinhead. Frame plate 32 through which a plurality of fill holes 32a for transferring adhesive 13' are formed is prepared. The positions of fill holes 32a in frame plate 32 correspond to the positions of bases 15 on substrate 11. Substrate 11 is placed on pedestal 31 and frame plate 32 is also fixed to pedestal 31 with, for example, a jig such that adhesive 13' can be transferred to each base 15. Adhesive 13' is fed onto frame plate 32 and imprinted from the top of frame plate 32 into each of fill holes 32a formed in frame plate 32 so as to fill each of fill holes 32a by moving squeegee 33 in direction A. Then, frame plate 32 is removed from pedestal 31 to transfer adhesive 13' onto bases 15 (step S2: transferring). Note that fill holes 32a are approximately equal in size to bases 15 in a plan view of substrate 11.

Moreover, even adhesive 13' were applied in a position shifted from the positions of bases 15 due to a positional shift of frame plate 32, adhesive 13 will remain in the center of each of bases 15 due to the surface tension of the melted adhesive 13' in the heating.

Note that if fill holes 32a are too big relative to the size of bases 15 in a plan view, the self-alignment effect of adhesive 13' is difficult to produce, and so in step S4 that follows, an amount of adhesive 13' is used that will produce the self-alignment effect. In other words, so long as the amount of adhesive 13' is neither too much nor too little, centerline O1 of adhesive 13' and centerline O2 of each base 15 can be easily approximately aligned.

Figure 7:
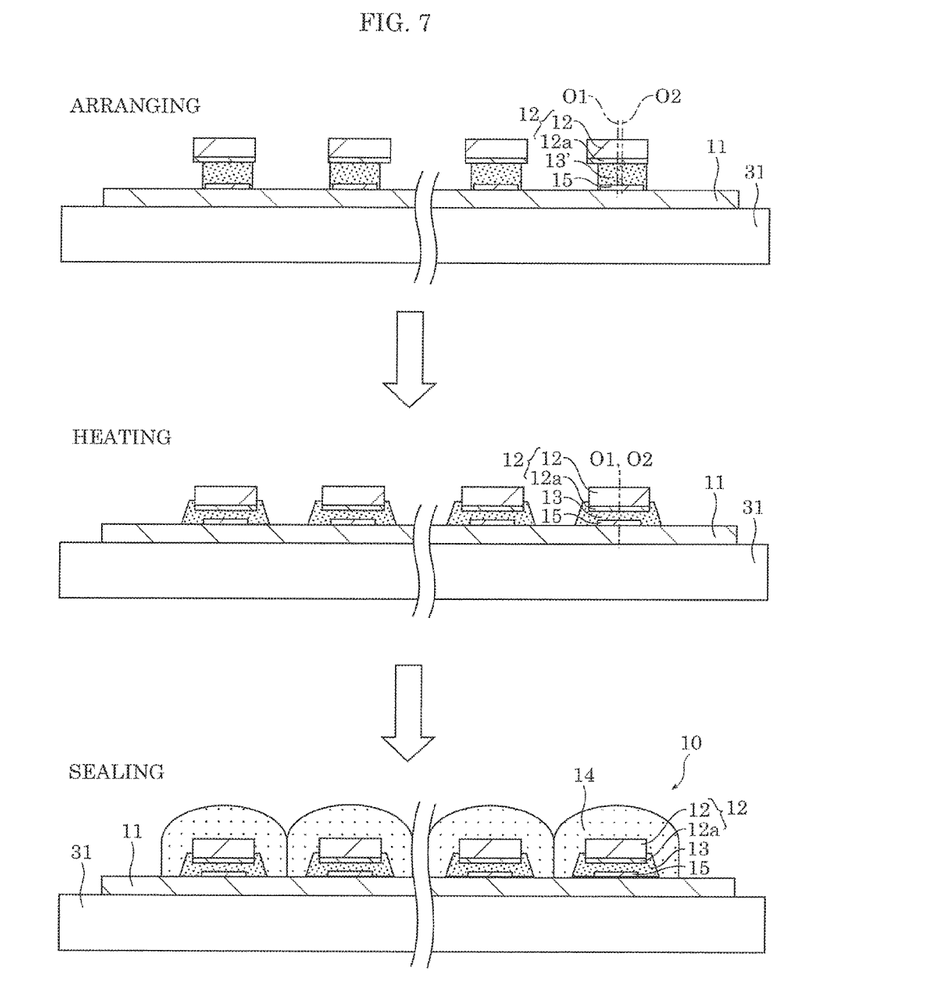
FIG. 7 schematically illustrates steps included in the method of manufacturing the light-emitting device according to Embodiment 1.

As illustrated in FIG. 5 and FIG. 7, next, LED chips 12 are arranged above each strip of adhesive 13' (step S3: arranging).

Next, adhesive 13' is heated so as to produce the self-alignment effect (step S4: heating). As a result, adhesive 13' melts into a liquid state, and in this state, LED chips 12 move such that centerline O1 of each LED chip 12 and centerline O2 of each base 15 become approximately aligned due to the self-alignment effect. With this, in the method of manufacturing light-emitting device 10, for example, even if LED chips 12 are incorrectly positioned in step S3, the incorrect positioning can be corrected.

Next, adhesive 13 is cured by cooling substrate 11 in a state in which centerline O1 of each LED chip 12 and centerline O2 of each base 15 are approximately aligned (step S5: curing).

Next, LED chips 12 are connected in series by conductive bonding wires 17 illustrated in FIG. 2.

Next, LED chips 12 and bases 15 are sealed with a sealing resin containing a phosphor. With this, LED chips 12 and bases 15 are sealed by the sealing resin (sealant) (step S6: sealing). Performing the sealing in this way produces light-emitting device 10 in which LED chips 12 and bases 15 are sealed by sealant 14. This ends the flow of processes in the method of manufacturing light-emitting device 10.

(Comparative Example)

Figure 4:
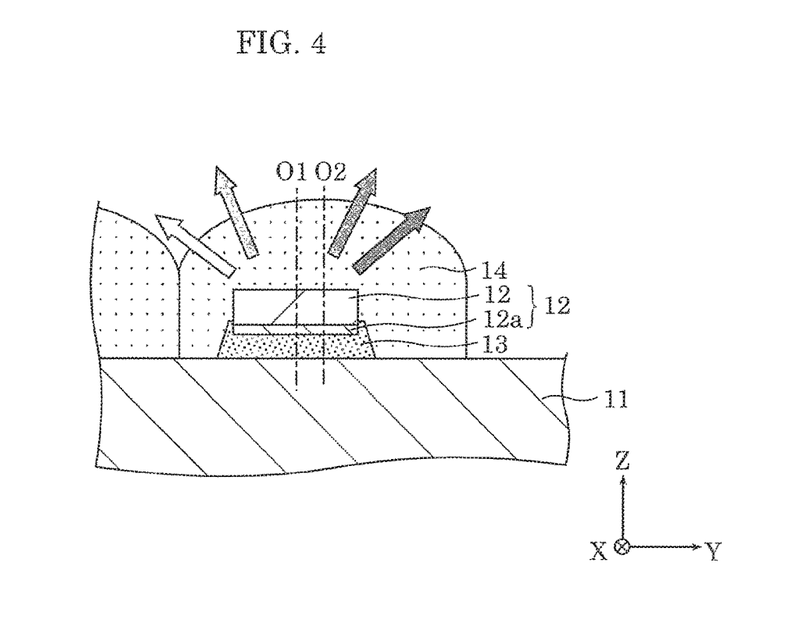
FIG. 4 is an enlarged cross sectional view of part of a light-emitting device according to a comparative example.

FIG. 4 is an enlarged cross sectional view of part of a light-emitting device according to a comparative example. Other elements in the comparative example are the same as in Embodiment 1, and like elements share like reference signs. Accordingly, detailed description of these elements is omitted.

In the comparative example illustrated in FIG. 4, substrate 11 does not include a base. In the comparative example as well, LED chips 12 are fixed to substrate 11 with adhesive 13 and sealed by sealant 14.

As illustrated in FIG. 4, centerline O1 of LED chip 12 and centerline O2 of sealant 14 are misaligned, and LED chip 12 is positioned in a shifted state in sealant 14. This is due to a misalignment occurring during the arrangement of the LED chips in the arranging step S3 in FIG. 5 according to Embodiment 1 and the LED chips being fixed while misaligned.

As such, with the light-emitting device according to the comparative example, when LED chips 12 emit light, the color of the light emitting from sealant 14 is not uniform, as indicated by the arrows.

(Working Effects)

Next, working effects of light-emitting device 10 according to this embodiment will be described.

As described above, light-emitting device 10 according to this embodiment includes substrate 11, bases 15 disposed on substrate 11, LED chips 12 mounted above bases 15, adhesive 13 that fixes LED chips 12 above bases 15, and sealant 14 that seals LED chips 12 and includes a phosphor that emits fluorescent light when stimulated by the light emitted from LED chips 12. In a plan view of bases 15 and LED chips 12, a span of at least a part of base 15 is less than or equal to a corresponding span of LED chip 12.

With this configuration, LED chips 12 are fixed to bases 15, which determine the positioning of LED chips 12, via adhesive 13. Moreover, in a plan view of substrate 11 and LED chips 12, LED chips 12 are arranged in positions that approximately align centerline O1 of LED chips 12 with centerline O2 of bases 15. As such, with light-emitting device 10, misalignment between LED chips 12 and sealant 14 can be inhibited.

Therefore, it is possible to inhibit non-uniform emission of light by light-emitting device 10.

Moreover, the method of manufacturing light-emitting device 10 according to this embodiment includes: preparing substrate 11; preparing bases 15 on substrate 11; transferring, onto bases 15, adhesive 13 for fixing LED chips 12 to substrate 11; after the transferring, arranging LED chips 12 above adhesive 13; after the arranging, heating adhesive 13 to produce a self-alignment effect of adhesive 13 for aligning LED chips 12 and bases 15; and curing adhesive 13 in a state in which a centerline of each base 15 that is approximately perpendicular to substrate 11 and a centerline of each LED chip 12 that is approximately perpendicular to substrate 11 are approximately aligned.

With, this configuration, even if centerline O1 of an LED chip 12 is misaligned with centerline O2 of a base 15 after the arranging is complete, a self-alignment effect is produced by adhesive 13 undergoing the heating, whereby centerline O1 of LED chip 12 and centerline O2 of base 15 approximately align. As such, with light-emitting device 10, misalignment between LED chips 12 and sealant 14 can be corrected. Therefore, it is possible to inhibit non-uniform emission of light by light-emitting device 10.

Moreover, in light-emitting device 10 according to this embodiment, LED chips 12 are aligned in the alignment direction above substrate 11. Moreover, bases 15 are aligned in the alignment direction, a measurement of each of bases 15 in a direction approximately perpendicular to the alignment direction being less than or equal to a measurement of each LED chip 12 in the direction approximately perpendicular to the alignment direction.

With this configuration, LED chips 12 are fixed to bases 15 in a state in which shifting of LED chips 12 is inhibited in a direction approximately perpendicular to the alignment direction of bases 15 (in a state in which a Y axis shift is inhibited). As such, in a view of a plane defined by the Z and Y axes, light emitted from LED chips 12 is emitted uniformly in color from sealant 14.

Moreover, in light-emitting device 10 according to this embodiment, LED chips 12 are aligned in the alignment direction on substrate 11. Moreover, bases 15 are aligned in the alignment direction, a measurement of each base 15 approximately in the alignment direction being less than or equal to a measurement of each LED chip 12 approximately in the alignment direction.

With this configuration, LED chips 12 are fixed to bases 15 at approximately even intervals in a state in which shifting of LED chips 12 is inhibited in the alignment direction of bases 15 (in a state in which an X axis shift is inhibited). As such, in a view of a plane defined by the Z and X axes, light emitted from LED chips 12 is emitted uniformly in color from sealant 14.

Moreover, in the light-emitting device 10 according to this embodiment, bases 15 protrude from the front surface of substrate 11.

With this configuration, LED chips 12 can be easily positioned in place. Accordingly, centerline O1 of LED chips 12 and centerline O2 of bases 15 can be easily approximately aligned.

In particular, during manufacturing, since the melted adhesive 13 is easily suspended in the region surrounding each base 15 due to the surface tension of the melted adhesive 13 in the heating, adhesive 13' easily produces the self-alignment effect.

Moreover, in light-emitting device 10 according to this embodiment, bases 15 are metallic thin films. Moreover, the metallic thin films are between LED chips 12 and substrate 11. Adhesive 13 contains solder particles.

With this configuration, using adhesive 13 containing solder particles yields a high affinity between bases 15 and metallic thin film 12a provided on LED chips 12, and makes it easy to fix LED chips 12 to substrate 11. With LED chips 12 on which metallic thin film 12a is formed, a defect in which the sapphire substrate used in LED chips 12 does not blend well with adhesive 13 containing solder particles tends not to occur.

In particular, when adhesive 13 containing solder particles is a solder cream, in the transferring in the method of manufacturing light-emitting device 10, adhesive 13 is easily transferred to bases 15. Moreover, since adhesive 13 contains solder particles, even if adhesive 13 were melted in the heating, it is easily suspended on bases 15.

Moreover, in light-emitting device 10 according to this embodiment, in a plan view of each base 15 and each LED chip 11, an entirety of base 15 is covered by LED chip 11.

Moreover, in light-emitting device 10 according to this embodiment, in a plan view of bases 15 and LED chips 11, a width of each base 15 is less than or equal to a width of each LED chip 11, and in the plan view of bases 15 and LED chips 11, a length of each base 15 is less than or equal to a length of each LED chip 11.

Moreover, in light-emitting device 10 according to this embodiment, LED chips 11 are aligned in the alignment direction above the substrate, bases 15 are aligned in the alignment direction, and bases 15 correspond one-to-one with LED chips 11.

Moreover, in light-emitting device 10 according this embodiment, LED chips 11 are aligned in the alignment direction above the substrate, and base 15 may be a single, elongated base which extends in the alignment direction.

Moreover, in light-emitting device 10 according to this embodiment, in a plan view of bases 15 and LED chips 11, a center line of each LED chip 11 is aligned with a center line of a corresponding base 15.

Moreover, in light-emitting device 10 according to this embodiment, adhesive 13 is thermally modified, whereby adhesive 13 produces a self-alignment effect to align the center line of LED chip 11 and the center line of base 15.

Moreover, in light-emitting device 10 according to this embodiment, in a plan view of bases 15 and LED chips 11, adhesive 13 covers bases 15.

Moreover, in light-emitting device 10 according to this embodiment, LED chips 11 include first light-emitting elements and second light-emitting elements, and the second light-emitting elements include an emission peak wavelength higher than the first light-emitting elements.

Moreover, in light-emitting device 10 according to this embodiment, the first light-emitting elements emit light having a first color, the phosphor includes first phosphor particles and second phosphor particles, a first portion of the light having the first color is converted into light having a second color by the first phosphor particles, a second portion of the light having the first color is converted into light having a third color by the second phosphor particles, the second light-emitting elements emit light having a fourth color, the sealant diffuses and mixes a third portion of the light having the first color, the light having the second color, the light having the third color, and the light having the fourth color to emit light having a fifth color, and the first color, the second color, the third color, the fourth color, and the fifth color are different.

Moreover, in light-emitting device 10 according to this embodiment, LED chips 11 are aligned in the alignment direction above substrate 11, sealant 14 is provided on substrate 11 to cover all of LED chips 11, sealant 14 is elongated in the alignment direction, and an optical axis of each LED chip 11 passes through a peak of sealant 14.

Variation 1 of Embodiment 1

Hereinafter, light-emitting device 10 according to this embodiment variation will be described with reference to FIG. 8.

Figure 8:
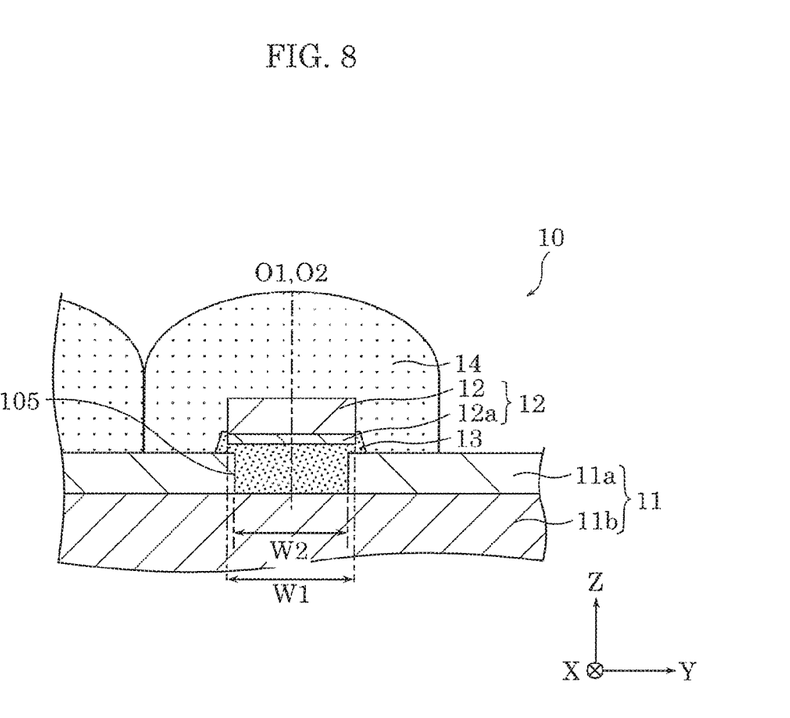
FIG. 8 is an enlarged cross sectional view of part of a light-emitting device according to a variation of Embodiment 1.

FIG. 8 is an enlarged cross sectional view of part of light-emitting device 10 according to an embodiment variation.

In Embodiment 1, bases 15 are formed as protrusions using metallic thin film, but in this embodiment variation, bases 105 differ in that they are formed as recesses.

Other elements in this embodiment variation are the same as in Embodiment 1, and like elements share like reference signs. Accordingly, detailed description of these elements is omitted.

As illustrated in FIG. 8, substrate 11 includes resist layer 11a provided on the front surface of substrate 11 and metallic layer 11b provided on the rear surface of resist layer 11a. Bases 105 are formed in substrate 11, recessed from the front surface of resist layer 11a (positive Z axis surface) to metallic layer 11b. Stated differently, bases 105 are formed as recesses that expose metallic layer 11b from resist layer 11a if adhesive 13 and LED chips 12 are removed. Adhesive 13 fills bases 105. In this embodiment variation, bases 105 recede to metallic layer 11b, but bases 105 may be recesses in resist layer 11a that do not recede all the way to metallic layer 11b.

(Working Effects)

Next, working effects of light-emitting device 10 according to this embodiment variation will be described.

Moreover, in light-emitting device 10 according to this embodiment variation, LED chips 12 are aligned in the alignment direction above substrate 11. Moreover, bases 105 are recesses in the front surface of substrate 11. Bases 105 are aligned in the alignment direction, a measurement of each base 105 in a direction approximately perpendicular to the alignment direction being less than or equal to a measurement of each LED chip 12 in the direction approximately perpendicular to the alignment direction.

With this configuration, LED chips 12 are fixed to bases 105 at approximately even intervals in a state in which shifting of LED chips 12 is inhibited in the alignment direction of bases 105. As such, in a view of a plane defined by the Z and Y axes, light emitted from LED chips 12 is emitted uniformly in color from sealant 14.

Moreover, in light-emitting device 10 according to this embodiment variation, LED chips 12 are aligned in the alignment direction above substrate 11. Moreover, bases 105 are recesses in the front surface of substrate 11. Bases 105 are aligned in the alignment direction, a measurement of each base 105 approximately in the alignment direction being less than or equal to a measurement of each LED chip 12 approximately in the alignment direction.

With this configuration, LED chips 12 are fixed to bases 105 at approximately even intervals in a state in which shifting of LED chips 12 is inhibited in the alignment direction of bases 105. As such, in a view of a plane defined by the Z and X axes, light emitted from LED chips 12 is emitted uniformly in color from sealant 14.

Moreover, the working effects of light-emitting device 10 according to this embodiment variation are the same as those achieved with Embodiment 1.

Embodiment 2

Next, lighting device 200 according to this embodiment will be described with reference to FIG. 9 and FIG. 10.

Figure 9:
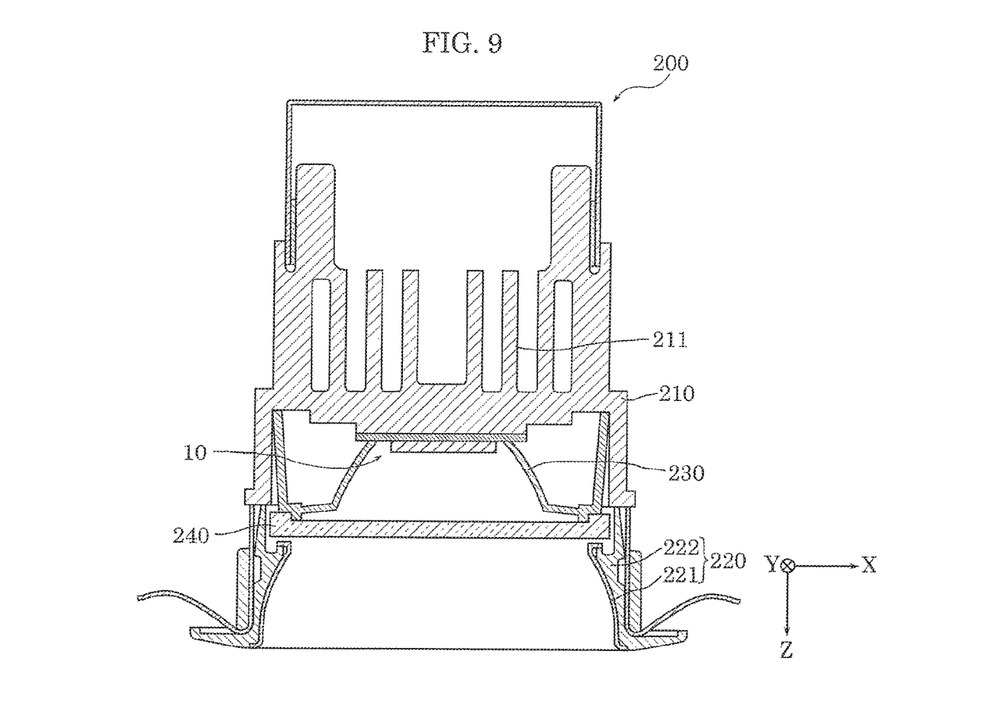
FIG. 9 is a cross sectional view of the lighting device according to Embodiment 2.

FIG. 9 is a cross sectional view of lighting device 200 according to this embodiment. FIG. 10 is a perspective view of lighting device 200 according to this embodiment.

(Configuration)

First, the configuration of lighting device 200 according to this embodiment will be described.

Figure 10:
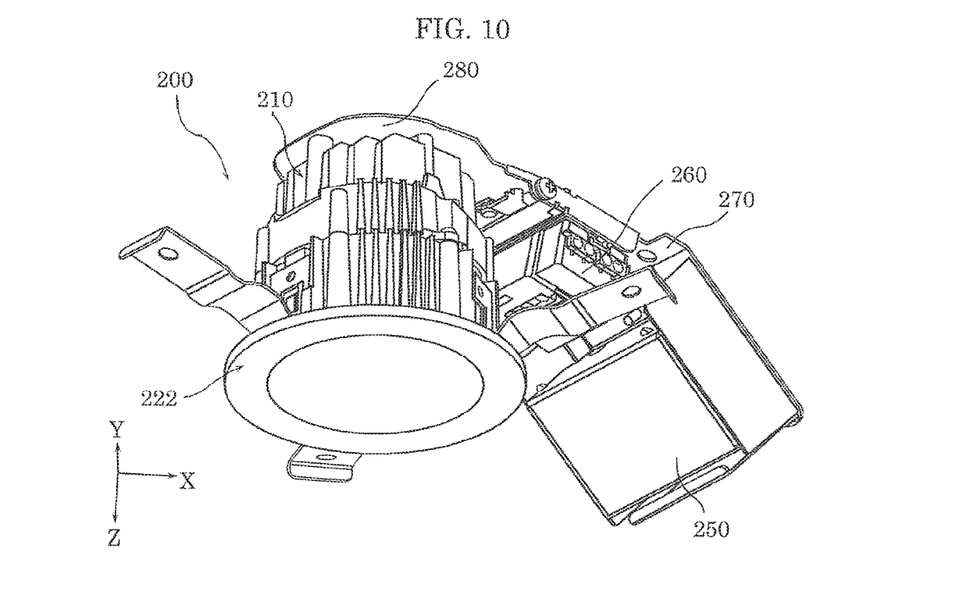
FIG. 10 is a perspective view of the lighting device according to Embodiment 2.

As illustrated in FIG. 9 and FIG. 10, lighting device 200 according to this embodiment is, for example, a recessed lighting device such as a downlight that is installed recessed in the ceiling of, for example, a home and emits light downward (onto the floor or a wall, for example).

Lighting device 200 includes light-emitting device 10. Lighting device 200 further includes: a fixture body having an approximately bottomed tubular shape, configured as a result of base portion 210 and frame portion 220 being coupled together; reflective plate 230 disposed on the fixture body; and light-transmissive panel 240 disposed on the fixture body.

Base portion 210 is an attachment pedestal to which light-emitting device 10 attaches and is a heat sink that radiates heat generated by light-emitting device 10. Base portion 210 is formed into an approximately cylindrical shape using a metal material, and in this embodiment, is made of cast aluminum.

A plurality of heat dissipating fins 211 protruding in the negative direction along the Z axis are provided aligned in a single direction on the top portion (ceiling end portion) of base portion 210 so as to be evenly spaced apart. With this, the heat generated by light-emitting device 10 can be effectively dissipated.

Frame portion 220 includes cone portion 221 that is approximately cylindrical in shape and has a reflective inner surface, and frame portion main body 222 to which cone portion 221 is attached. Cone portion 221 is formed of a metal material, and can be manufactured by, for example, drawing or press forming aluminum alloy, for example. Frame portion main body 222 is formed of a hard resin material or a metal material. Frame portion 220 is fixed as a result of frame portion main body 222 being attached to base portion 210.

Reflective plate 230 is a reflective component having an annulus frame-like shape (funnel shape) and has an inner surface reflecting function. Reflective plate 230 can be formed using a metal material such as aluminum. Note that reflective plate 230 need not be formed using a metal material, and may be formed using a hard white resin material.

Light-transmissive panel 240 is a light-transmissive component having light diffusing and light transmitting properties. Light-transmissive panel 240 is a flat plate disposed between reflective plate 230 and frame portion 220, and is attached to reflective plate 230. Light-transmissive panel 240 can be formed into a disc shape using a clear resin material such as acrylic or polycarbonate.

Note that lighting device 200 need not include light-transmissive panel 240. The luminous flux of light radiating from lighting device 200 can be improved by omitting light-transmissive panel 240.

Moreover, as illustrated in FIG. 10, power device 250 and terminal block 260 are attached to lighting device 200. Power device 250 supplies light-emitting device 10 with power for turning on light-emitting device 10, and terminal block 260 relays AC power supplied from a utility power source to power device 250.

Power device 250 and terminal block 260 are fixed to attachment plate 270, which is a separate component from the fixture body. Attachment plate 270 is formed by bending a rectangular component made of a metal material. Power device 250 is fixed to the bottom surface of one lengthwise end of attachment plate 270, and terminal block 260 is fixed to the bottom surface of the other longwise end. Attachment plate 270 is interlocked with ceiling plate 280 fixed to the top portion of base portion 210 of the fixture body.

Since lighting device 200 includes light-emitting device 10, lighting device 200 inhibits a decrease in light emission intensity of red light. In other words, lighting device 200 can be said to be a lighting device capable of realizing desired color rendering properties.

Note that in this embodiment, the lighting device is exemplified as a downlight, but the present disclosure may be realized as a different lighting device such as a spot light.

(Working Effects)

Next, working effects of lighting device 200 according to this embodiment will be described.

As described above, lighting device 200 according to this embodiment includes light-emitting device 10.

This configuration also achieves the same working effects achieved with light-emitting device 10 according to, for example, Embodiment 1.

Other Embodiments

Hereinbefore, the present disclosure has been described based on embodiments, but the present disclosure is not limited to the above embodiments.

For example, in the above embodiments, the first LED chips may be paired with a phosphor-containing resin that contains red and green phosphors. Alternatively, ultraviolet LED chips that emit ultraviolet light shorter in wavelength than the light emitted by the first LED chips may be paired with blue, red, and green phosphor particles that respectively emit blue, red, and green light when mainly stimulated by ultraviolet light.

Moreover, in the internal structure of each LED chip in the above embodiments, a reflective layer that reflects light may be provided between the metallic thin layer and the light-emitting layer that emits light. Moreover, the reflective layer may be a multi-layer film reflective layer formed by cyclically stacking materials having different refractive indexes. Note that the multi-layer film reflective layer may be formed as a growth layer, and may be formed from a deposition layer of an insulating material.

Moreover, in the above embodiments, the sealant may be formed uniformly over the LED chips. In such cases, for example, a dam material having a protruding shape whose cross section protrudes upward may be provided as a component for holding back the sealant. Examples of the dam material include a thermo setting resin or thermo plastic resin having insulating properties.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:
1. A light-emitting device, comprising:
a substrate;
a base on or defined by the substrate;
a light-emitting element above the base;
an adhesive that fixes the light-emitting element above the base; and
a sealant that seals the light-emitting element and includes a phosphor that emits fluorescent light when stimulated by light from the light-emitting element,
wherein, in a plan view of the base and the light-emitting element, a span of at least a part of the base is less than or equal to a corresponding span of the light-emitting element.
2. The light-emitting device according claim 1, wherein the base is on the substrate and protrudes from a surface of the substrate.
3. The light-emitting device according to claim 2, wherein the light-emitting element comprises a plurality of light-emitting elements aligned in an alignment direction above the substrate, and
the base comprises a plurality of bases aligned in the alignment direction, a measurement of each of the plurality of bases in a direction approximately perpendicular to the alignment direction being less than or equal to a measurement of each of the plurality of light-emitting elements in the direction approximately perpendicular to the alignment direction.
4. The light-emitting device according to claim 2, wherein the light-emitting element comprises a plurality of light-emitting elements aligned in an alignment direction on the substrate, and
the base comprises a plurality of bases aligned in the alignment direction, a measurement of each of the plurality of bases approximately in the alignment direction being less than or equal to a measurement of each of the plurality of light-emitting elements approximately in the alignment direction.
5. The light-emitting device according to claim 1, wherein the base is integral with the substrate and comprises a recess in a surface of the substrate.
6. The light-emitting device according to claim 5, wherein the light-emitting element comprises a plurality of light-emitting elements aligned in an alignment direction above the substrate,
the base comprises a plurality of recesses in the surface of the substrate, and
the plurality of bases is aligned in the alignment direction, a measurement of each of the plurality of bases in a direction approximately perpendicular to the alignment direction being less than or equal to a measurement of each of the plurality of light-emitting elements in the direction approximately perpendicular to the alignment direction.
7. The light-emitting device according to claim 5, wherein the light-emitting element comprises a plurality of light-emitting elements aligned in an alignment direction above the substrate,
the base comprises a plurality of recesses in the surface of the substrate, and
the plurality of bases is aligned in the alignment direction, a measurement of each of the plurality of bases approximately in the alignment direction being less than or equal to a measurement of each of the plurality of light-emitting elements approximately in the alignment direction.
8. The light-emitting device according to claim 1, wherein the base is a metallic thin film,
the metallic thin film is between the light-emitting element and the substrate, and
the adhesive contains solder particles.
9. The light-emitting device according to claim 1, wherein in a plan view of the base and the light-emitting element, an entirety of the base is covered by the light-emitting element.
10. The light-emitting device according to claim 1, wherein
in a plan view of the base and the light-emitting element, a width of the base is less than or equal to a width of the light-emitting element, and
in the plan view of the base and the light-emitting element, a length of the base is less than or equal to a length of the light-emitting element.
11. The light-emitting device according to claim 1, wherein
the light-emitting element comprises a plurality of light-emitting elements aligned in an alignment direction above the substrate,
the base comprises a plurality of bases aligned in the alignment direction, and
the plurality of bases corresponds one-to-one with the plurality of light-emitting elements.
12. The light-emitting device according to claim 1, wherein
the light-emitting element comprises a plurality of light-emitting elements aligned in an alignment direction above the substrate, and
the base comprises a single, elongated base which extends in the alignment direction.
13. The light-emitting device according to claim 1, wherein
in a plan view of the base and the light-emitting element, a center line of the light-emitting element is aligned with a center line of the base.
14. The light-emitting device according to claim 13, wherein
the adhesive is thermally modified,
whereby the adhesive produces a self-alignment effect to align the center line of the light-emitting element and the center line of the base.
15. The light-emitting device according to claim 1, wherein
in a plan view of the base and the light-emitting element, the adhesive covers the base.
16. The light-emitting device according to claim 1, wherein
the light-emitting element includes first light emitting elements and second light-emitting elements, and
the second light-emitting elements include an emission peak wavelength higher than the first light-emitting elements.
17. The light-emitting device according to claim 16, wherein
the first light-emitting elements emit light having a first color,
the phosphor includes first phosphor particles and second phosphor particles,
a first portion of the light having the first color is converted into light having a second color by the first phosphor particles, a second portion of the light having the first color is converted into light having a third color by the second phosphor particles, the second light-emitting elements emit light having a fourth color, the sealant diffuses and mixes a third portion of the light having the first color, the light having the second color, the light having the third color, and the light having the fourth color to emit light having a fifth color, and the first color, the second color, the third color, the fourth color, and the fifth color are different.

18. The light-emitting device according to claim 1, wherein the light-emitting element comprises a plurality of light-emitting elements aligned in an alignment direction above the substrate, the sealant is provided on the substrate to cover all of the plurality of light-emitting elements, the sealant is elongated in the alignment direction, and an optical axis of each of the plurality of light-emitting elements passes through a peak of the sealant.

19. A lighting device comprising the light-emitting device according to claim 1.

20. A method of manufacturing the light-emitting device according to claim 1, the method comprising:

preparing a substrate;

preparing a base on or defined by the substrate;

transferring, onto the base, an adhesive for fixing a light-emitting element to the substrate;

after the transferring, arranging the light-emitting element above the adhesive;

after the arranging, heating the adhesive to produce a self-alignment effect of the adhesive for aligning the light-emitting element and the base; and curing the adhesive in a state in which a centerline of the base that is approximately perpendicular to the substrate and a centerline of the light-emitting element that is approximately perpendicular to the substrate are approximately aligned.

* * * * *